(12) United States Patent
Chen et al.

(10) Patent No.: US 10,812,215 B2
(45) Date of Patent: Oct. 20, 2020

(54) DATA TRANSMISSION METHOD, APPARATUS, AND DEVICE

(71) Applicant: Huawei Technologies Co., Ltd., Shenzhen, Guangdong (CN)

(72) Inventors: Ying Chen, Hangzhou (CN); Hejia Luo, Hangzhou (CN); Rong Li, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/218,719

(22) Filed: Dec. 13, 2018

(65) Prior Publication Data

US 2019/0115997 A1  Apr. 18, 2019

Related U.S. Application Data

(63) Continuation of application No. PCT/CN2017/084186, filed on May 12, 2017.

(30) Foreign Application Priority Data

Jun. 14, 2016 (CN) .......................... 2016 1 0416893

(51) Int. Cl.
*H04W 56/00* (2009.01)
*H04L 1/00* (2006.01)
(Continued)

(52) U.S. Cl.
CPC .......... *H04L 1/0013* (2013.01); *H03M 13/13* (2013.01); *H03M 13/6362* (2013.01); *H04L 1/00* (2013.01);
(Continued)

(58) Field of Classification Search
CPC ....... H04L 1/0013; H04L 1/00; H04L 1/0041; H04L 1/0057; H04L 1/0069; H04L 5/0051; H04M 13/13; H04M 13/6362
(Continued)

(56) References Cited

U.S. PATENT DOCUMENTS 8,953,707 B2 * 2/2015 Ro ....................... H04B 7/0456
375/296
2016/0352464 A1  12/2016 Shen et al.
(Continued)

FOREIGN PATENT DOCUMENTS

CN       103281166 A    9/2013
CN       105164959 A    12/2015
(Continued)

OTHER PUBLICATIONS

Chen et al.,"Polar Coded HARQ Scheme with Chase Combining", 2014 IEEE Wireless Communications and Networking Conference (WCNC). IEEE, Apr. 6, 2014, 6 pages.
(Continued)

*Primary Examiner* — Sai Ming Chan
(74) *Attorney, Agent, or Firm* — Fish & Richardson P.C.

(57) ABSTRACT

Embodiments of the present disclosure provide a data transmission method, including: performing polar code coding on to-be-coded bits, to obtain a mother code, where a code length of the mother code is related to K and $M_i$, i=1, 2, . . . , K, K is a quantity of sending times, $M_i$ is a length of bits sent at an $i^{th}$ time, and K and $M_i$ are positive integers greater than 1; performing rate matching on the mother code, to obtain to-be-sent bits, where a quantity of the to-be-sent bits is a sum of lengths of bits sent at K times; and sending $M_i$ to-be-sent bits at the $i^{th}$ time.

11 Claims, 12 Drawing Sheets

(51) Int. Cl.
  *H03M 13/13* (2006.01)
  *H03M 13/00* (2006.01)
  *H04L 5/00* (2006.01)
  *H04L 1/08* (2006.01)
  *H04L 1/18* (2006.01)

(52) U.S. Cl.
  CPC .......... *H04L 1/0041* (2013.01); *H04L 1/0057* (2013.01); *H04L 1/0069* (2013.01); *H04L 5/0051* (2013.01); *H04L 1/08* (2013.01); *H04L 1/189* (2013.01)

(58) Field of Classification Search
  USPC ........................................................ 370/329
  See application file for complete search history.

(56) References Cited

U.S. PATENT DOCUMENTS

| | | |
|---|---|---|
| 2017/0005753 A1 | 1/2017 | Shen et al. |
| 2017/0019214 A1 | 1/2017 | Shen et al. |
| 2019/0089380 A1 | 3/2019 | Shen et al. |

FOREIGN PATENT DOCUMENTS

| | | |
|---|---|---|
| CN | 105227189 A | 1/2016 |
| CN | 105075163 B | 2/2019 |
| WO | 2015139248 A1 | 9/2015 |
| WO | 2015149225 A1 | 10/2015 |

OTHER PUBLICATIONS

Huawei et al.,"PUSCH coverage enhancement for MTC UEs", R1-155114 3GPP TSG RAN WG1 Meeting #82bis, Malmo, Sweden, Oct. 5-9, 2015, 6 pages.

Huawei et al.,"Overview of Polar Codes",R1-162161 3GPP TSG RAN WG1 Meeting #84bis ,Busan, Korea, Apr. 11-15, 2016, 8 pages.

Extended European Search Report issued in European Application No. 17812493.9 dated Jun. 24, 2019, 10 pages.

3GPP TS 36.212 V13.1.0 (Mar. 2016), 3rd Generation Partnership Project; Technical Specification Group Radio Access Network; Evolved Universal Terrestrial Radio Access (E-UTRA); Multiplexing and channel coding (Release 13), 129 pages.

Office Action issued in Chinese Application No. 201610416893.7 dated Nov. 18, 2019, 12 pages (with English translation).

\* cited by examiner

DATA TRANSMISSION METHOD, APPARATUS, AND DEVICE

CROSS-REFERENCE TO RELATED APPLICATIONS

This application is a continuation of International Application No. PCT/CN2017/084186, filed on May 12, 2017, which claims priority to Chinese Patent Application No. 201610416893.7, filed on Jun. 14, 2016, the disclosures of the aforementioned applications are hereby incorporated by reference in their entireties.

TECHNICAL FIELD

Embodiments of the present application relate to wireless communications technologies, and in particular, to a data transmission method, apparatus, and device.

BACKGROUND

With development of wireless communications, an Internet of Things (IoT) communications system presents some new characteristics, such as high reliability, low complexity, and wide coverage.

However, existing mainstream codes such as a turbo code and a low-density parity-check (LDPC) code cannot well meet a requirement of the IoT communications system. In terms of performance, although the turbo code and the LDPC code can approach a Shannon limit with longer code length, it is difficult for the turbo code and the LDPC code to achieve ideal performance in a limited code length due to coding/decoding characteristics of the turbo code and the LDPC code. In terms of implementation, the turbo code and the LDPC code have relatively high complexity in a coding/decoding implementation process. Therefore, in the IoT communications system, a new coding technology is urgently required to resolve a prior-art problem in terms of a short packet, reliability, and complexity.

Recently, a polar code is a first and known unique channel coding method that can be strictly proved to "achieve" the Shannon limit. Coding and decoding of the polar code are briefly described as follows:

The polar code is a linear block code. It is assumed that a generator matrix of the polar code is $G_N$, and a coding process of the polar code is $x_1^N = u_1^N G_N$, where $u_1^N = (u_1, u_2, \ldots, u_N)$ includes to-be-coded bits whose length is N, and N is a positive integer greater than 1. $G_N$ is an N×N matrix, and $G_N = B_N F_2^{\otimes(\log_2(N))}$, where $$F_2 = \begin{bmatrix} 1 & 0 \\ 1 & 1 \end{bmatrix},$$

$B_N$ is an N×N transposed matrix, for example, a bit reversal matrix, and $F_2^{\otimes(\log_2(N))}$ is a Kronecker (English: Kronecker) product of $\log_2 N$ matrices $F_2$. The foregoing addition and multiplication operations are all addition and multiplication operations in a binary Galois Field.

A most basic decoding method of the polar code is successive cancellation (SC) decoding. A subsequently proposed SC-List decoding algorithm improves decoding performance of a short code through lateral path extension and cyclic redundancy check (CRC) selection.

In a limited code length, performance of the polar code is better than that of the Turbo code and the LDPC code. In addition, the polar code has relatively low calculation complexity in terms of coding/decoding. The polar code has great development and application prospects in the IoT communications system due to these advantages of the polar code.

However, most wireless communications systems need to be able to support wider coverage and more devices at relatively low costs and complexity. For a wide coverage scenario of a wireless communications system, some hybrid automatic repeat request (HARQ) solutions of the polar code are applicable to this scenario. FIG. 1 shows a method for implementing wide coverage in a wireless communications system. As shown in FIG. 1, data that needs to be repeatedly transmitted may be sent at a plurality of times in a relatively far coverage area by using a hybrid automatic repeat request. A larger coverage area may indicate a larger quantity of HARQ times and more required transmission resources. In addition, there is a larger amount of signaling interaction between a transmit end and a receive end in a HARQ process. For example, after each time of decoding, the receive end needs to transmit a negative acknowledgement (NACK) message or an acknowledgement (ACK) message to the transmit end by using a feedback link, to notify the transmit end of whether the decoding is correct, until decoding succeeds or a maximum preset quantity of retransmission times is reached. Therefore, signaling overheads are very high in this retransmission method in the wireless communications system.

SUMMARY

In view of this, embodiments of the present disclosure provide a data transmission method, apparatus, and device. During channel coding, a quantity of retransmission request times is reduced in consideration of impact of a quantity of sending times, so that signaling overheads can be greatly reduced.

According to a first aspect, an embodiment of the present disclosure provides a data transmission method, including:

performing polar code coding on to-be-coded bits, to obtain a mother code, where a code length of the mother code is related to K and $M_i$, i=1, 2, ..., K, K is a quantity of sending times, $M_i$ is a length of bits sent at an $i^{th}$ time, and K and $M_i$ are positive integers greater than 1;

performing rate matching on the mother code, to obtain to-be-sent bits, where a quantity of the to-be-sent bits is a sum of lengths of bits sent at K times; and sending $M_i$ to-be-sent bits at the $i^{th}$ time.

A mother code that better meets an actual transmission requirement may be obtained by using the quantity of sending times during polar code coding, so that a polar code coding gain can be fully used. In addition, signaling does not need to be sent in real time to request retransmission, so that signaling overheads can be reduced.

In a possible implementation, the quantity of sending times is determined based on channel quality, a coverage area, or a communications quality requirement. For example, better channel quality indicates a smaller quantity of sending times; a smaller coverage area indicates a smaller quantity of sending times; and a higher communications quality requirement indicates a larger quantity of sending times.

In a possible implementation, the code length of the mother code is $$2^{\lceil \log_2(\Sigma_{i=1}^{K} M_i) \rceil}.$$

In addition, $\lceil \cdot \rceil$ indicates rounding up in the present disclosure.

In a possible implementation, the performing rate matching on the mother code, to obtain to-be-sent bits includes:

if $\sum_{i=1}^{K} M_i$ is less than $$2^{\lceil \log_2(\Sigma_{i=1}^{K} M_i) \rceil},$$

puncturing $$2^{\lceil \log_2(\Sigma_{i=1}^{K} M_i) \rceil} - \sum_{i=1}^{K} M_i$$

bits in the mother code, to obtain the to-be-sent bits; or if $$\sum_{i=1}^{K} M_i$$

is equal to $$2^{\lceil \log_2(\Sigma_{i=1}^{K} M_i) \rceil},$$

using the mother code as the to-be-sent bits.

In a possible implementation, the quantity of sending times is preset or is indicated by using signaling.

According to a second aspect, an embodiment of the present disclosure provides a data transmission apparatus, including:

a coding module, configured to perform polar code coding on to-be-coded bits, to obtain a mother code, where a code length of the mother code is related to K and $M_i$, i=1, 2, . . . , K, K is a quantity of sending times, $M_i$ is a length of bits sent at an $i^{th}$ time, and K and $M_i$ are positive integers greater than 1;

a rate matching module, configured to perform rate matching on the mother code obtained by the coding module, to obtain to-be-sent bits, where a quantity of the to-be-sent bits is a sum of lengths of bits sent at K times; and a sending module, configured to send $M_i$ to-be-sent bits at the $i^{th}$ time.

It should be noted that during actual implementation, the coding module and the rate matching module may be integrated together, or functions of the two modules may be directly implemented by using a processing module.

A mother code that better meets an actual transmission requirement may be obtained by using the quantity of sending times during polar code coding, so that a polar code coding gain can be fully used. In addition, signaling does not need to be sent in real time to request retransmission, so that signaling overheads can be reduced.

In a possible implementation, the quantity of sending times is determined based on channel quality, a coverage area, or a communications quality requirement. For example, better channel quality indicates a smaller quantity of sending times; a smaller coverage area indicates a smaller quantity of sending times; and a higher communications quality requirement indicates a larger quantity of sending times.

In a possible implementation, the code length of the mother code is $$2^{\lceil \log_2(\Sigma_{i=1}^{K} M_i) \rceil}.$$

In addition, $\lceil \cdot \rceil$ indicates rounding up in the present disclosure.

In a possible implementation, the rate matching module is specifically configured to:

if $$\sum_{i=1}^{K} M_i$$

is less than $$2^{\lceil \log_2(\Sigma_{i=1}^{K} M_i) \rceil},$$

puncture $$2^{\lceil \log_2(\Sigma_{i=1}^{K} M_i) \rceil} - \sum_{i=1}^{K} M_i$$

bits in the mother code, to obtain the to-be-sent bits; or if $$\sum_{i=1}^{K} M_i$$

is equal to $$2^{\lceil \log_2(\Sigma_{i=1}^{K} M_i) \rceil},$$

use the mother code as the to-be-sent bits.

In a possible implementation, the quantity of sending times is preset or is indicated by using signaling.

In a possible implementation, the data transmission apparatus provided in this embodiment of the present disclosure may be a network entity (for example, a base station), or may be a user terminal.

According to a third aspect, an embodiment of the present disclosure provides a data transmission device, including: a processor, a transmitter, and a bus, where the processor and the transmitter are connected by using the bus;

the processor is configured to: perform polar code coding on to-be-coded bits, to obtain a mother code, where a code length of the mother code is related to K and $M_i$, i=1, 2, ..., K, K is a quantity of sending times, $M_i$ is a length of bits sent at an $i^{th}$ time, and K and $M_i$ are positive integers greater than 1; and perform rate matching on the mother code, to obtain to-be-sent bits, where a quantity of the to-be-sent bits is a sum of lengths of bits sent at K times; and the transmitter is configured to send $M_i$ to-be-sent bits at the $i^{th}$ time.

A mother code that better meets an actual transmission requirement may be obtained by using the quantity of sending times during polar code coding, so that a polar code coding gain can be fully used. In addition, signaling does not need to be sent in real time to request retransmission, so that signaling overheads can be reduced.

In a possible implementation, the quantity of sending times is determined based on channel quality, a coverage area, or a communications quality requirement. For example, better channel quality indicates a smaller quantity of sending times; a smaller coverage area indicates a smaller quantity of sending times; and a higher communications quality requirement indicates a larger quantity of sending times.

In a possible implementation, the code length of the mother code is $$2^{\lceil \log_2(\Sigma_{i=1}^{K} M_i) \rceil}.$$

In addition, $\lceil \cdot \rceil$ indicates rounding up in the present disclosure.

In a possible implementation, the processor is specifically configured to:

if $$\sum_{i=1}^{K} M_i$$

is less than $$2^{\lceil \log_2(\Sigma_{i=1}^{K} M_i) \rceil},$$

puncture $$2^{\lceil \log_2(\Sigma_{i=1}^{K} M_i) \rceil} - \sum_{i=1}^{K} M_i$$

bits in the mother code, to obtain the to-be-sent bits; or if $$\sum_{i=1}^{K} M_i$$

is equal to $$2^{\lceil \log_2(\Sigma_{i=1}^{K} M_i) \rceil},$$

use the mother code as the to-be-sent bits.

In a possible implementation, the quantity of sending times is preset or is indicated by using signaling.

In a possible implementation, the data transmission device may be a network entity (for example, a base station), or may be a user terminal.

According to a fourth aspect, an embodiment of the present disclosure provides a data transmission method, including:

receiving $M_i$ bits at an $i^{th}$ time, where i=1, 2, ..., K, K is a quantity of receiving times, and K and $M_i$ are positive integers greater than 1; and performing rate de-matching on received bits, to obtain a mother code, where a code length of the mother code is related to K and $M_i$; and performing polar code decoding on the mother code, to obtain transmitted bits.

In a possible implementation, the code length of the mother code is $$2^{\lceil \log_2(\Sigma_{i=1}^{K} M_i) \rceil}.$$

In a possible implementation, a receive end receives $$\sum_{i=1}^{K} M_i$$

bits; and if $$\sum_{i=1}^{K} M_i$$

is less than $$2^{\lceil \log_2(\Sigma_{i=1}^{K} M_i) \rceil},$$

the $$\sum_{i=1}^{K} M_i$$

bits are de-punctured, to obtain the mother code, where a quantity of de-punctured bits is $$2^{\lceil \log_2(\Sigma_{i=1}^{K} M_i) \rceil} - \sum_{i=1}^{K} M_i;$$

or if $$\sum_{i=1}^{K} M_i$$

is equal to $$2^{\lceil \log_2(\Sigma_{i=1}^{K} M_i) \rceil},$$

the $$\sum_{i=1}^{K} M_i$$

bits are used as the mother code.

In a possible implementation, the quantity of receiving times is preset or is indicated by using signaling.

It should be noted that, de-puncturing in this embodiment of the present disclosure means: based on a requirement, filling to-be-de-punctured data with 0 or a fixed value, for example, filling a punctured bit with 0.

According to a fifth aspect, an embodiment of the present disclosure provides a data transmission device, including: a processor, a receiver, and a bus, where the processor and the receiver are connected by using the bus;

the receiver is configured to receive $M_i$ bits at an $i^{th}$ time, where i=1, 2, ..., K, K is a quantity of receiving times, and K and $M_i$ are positive integers greater than 1; and the processor is configured to: perform rate de-matching on received bits, to obtain a mother code, where a code length of the mother code is related to K and $M_i$; and perform polar code decoding on the mother code, to obtain transmitted bits.

In a possible implementation, the code length of the mother code is $$2^{\lceil \log_2(\Sigma_{i=1}^{K} M_i)\rceil}.$$

In a possible implementation, the receiver receives $$\sum_{i=1}^{K} M_i$$

bits; and if $$\sum_{i=1}^{K} M_i$$

is less than $$2^{\lceil \log_2(\Sigma_{i=1}^{K} M_i)\rceil},$$

the $$\sum_{i=1}^{K} M_i$$

bits are de-punctured, to obtain the mother code, where a quantity of de-punctured bits is $$2^{\lceil \log_2(\Sigma_{i=1}^{K} M_i)\rceil} - \sum_{i=1}^{K} M_i;$$

or if $$\sum_{i=1}^{K} M_i$$

is equal to $$2^{\lceil \log_2(\Sigma_{i=1}^{K} M_i)\rceil},$$

the $$\sum_{i=1}^{K} M_i$$

bits are used as the mother code.

In a possible implementation, the quantity of receiving times is preset or is indicated by using signaling.

In a possible implementation, the data transmission device may be a network entity (for example, a base station), or may be a user terminal.

According to a sixth aspect, an embodiment of the present disclosure provides a computer storage medium, configured to store a computer software instruction used by the foregoing device, where the computer storage medium includes a program for performing the foregoing aspects.

According to a seventh aspect, an embodiment of the present disclosure provides a computer program product, including a non-transitory computer readable storage medium configured to store a computer executable instruction, where the computer executable instruction is used to instruct a processor to perform the steps in the foregoing aspects.

In the embodiments of the present disclosure, polar code coding is optimized during data transmission, and the quantity of sending times is used in a coding phase to repeatedly code information bits, so that a polar code coding gain is fully used, and system performance is improved. In addition, signaling does not need to be sent in real time to request retransmission, so that signaling overheads can be reduced.

BRIEF DESCRIPTION OF DRAWINGS

Accompanying drawings are included in and constitute a part of this specification, and same numbers describe a same component. The accompanying drawings describe embodiments of the present disclosure and are intended to explain principles of the present disclosure in combination with the described content.

DESCRIPTION OF EMBODIMENTS

Various embodiments of the present disclosure are referenced in detail, and examples of the embodiments are shown in the accompanying drawings. Although descriptions are provided with reference to these embodiments, it may be understood that these embodiments are not used to limit the present disclosure to these embodiments. Instead, the present disclosure is intended to cover a replacement technology, a modification technology, and an equivalent technology that may be included within the spirit and scope of the present disclosure limited in the appended claims. In addition, in the following detailed descriptions of the present disclosure, many specific details are described to provide a thorough understanding of the present disclosure. However, it may be understood that during actual application, these specific details of the present disclosure may not be included. A well-known method, process, component, and circuit are not described in detail in another example, to prevent various aspects of the present disclosure from being unnecessarily blurred.

Figure 1:
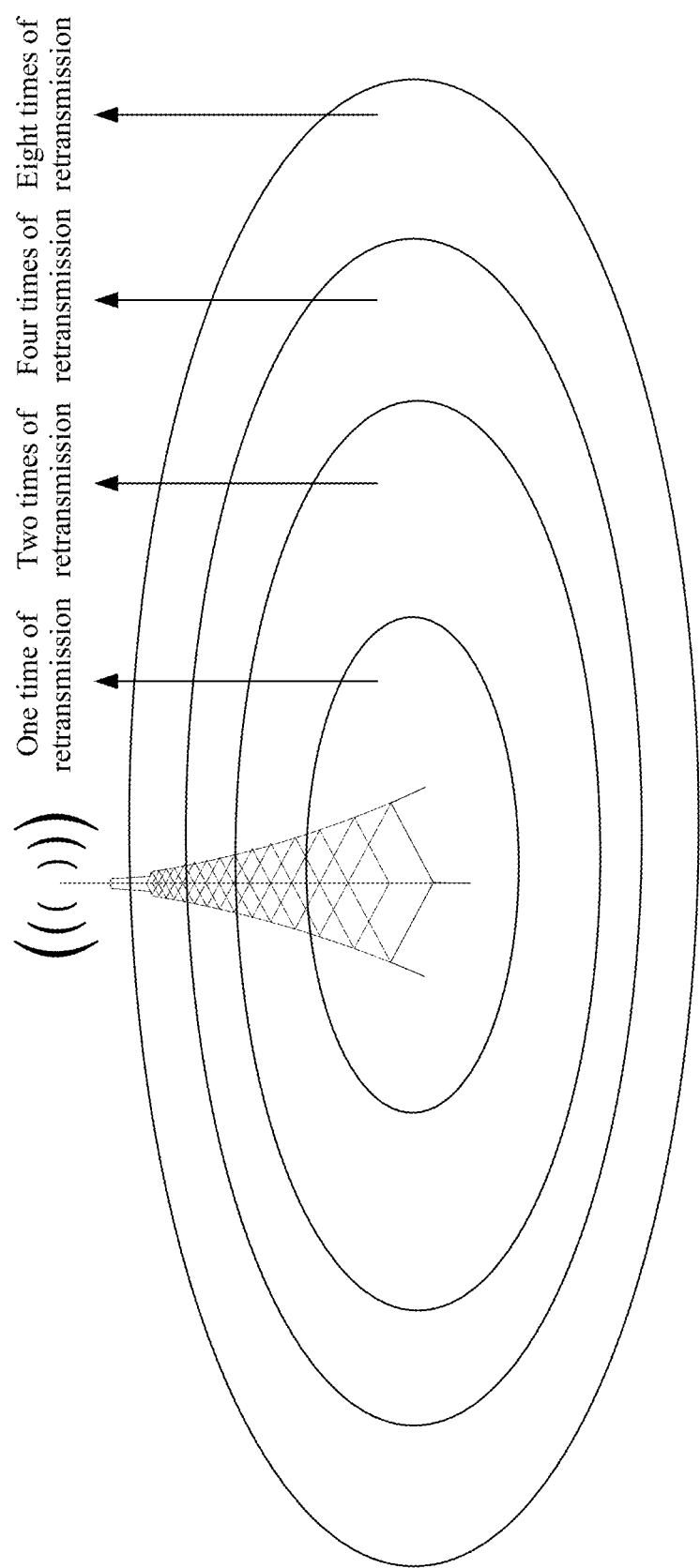
FIG. 1 shows a method for implementing wide coverage in a wireless communications system.
Figure 2:
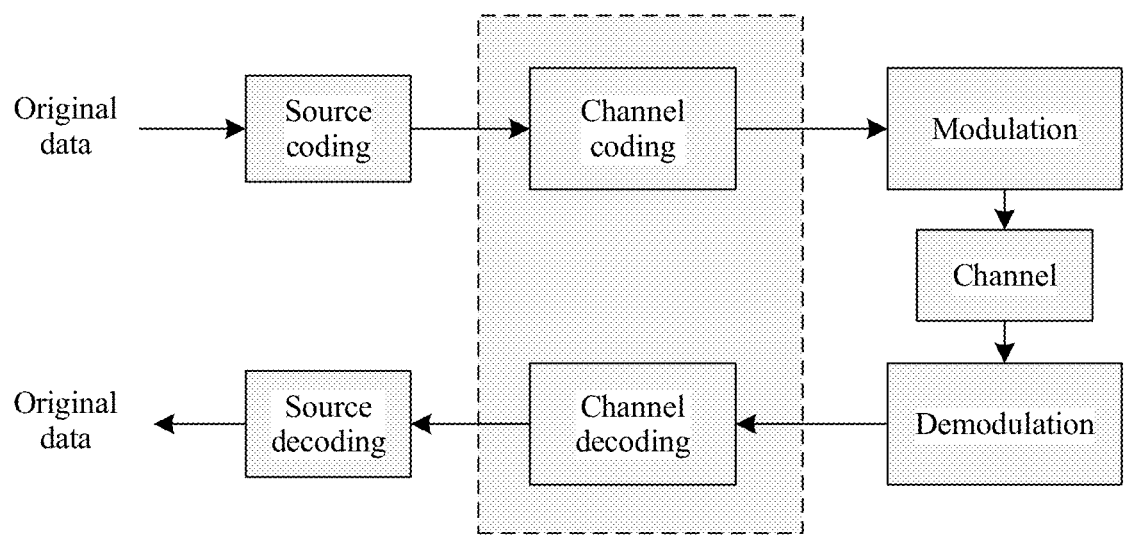
FIG. 2 is a schematic diagram of a communications system.

FIG. 2 is a schematic diagram of a communications system. As shown in FIG. 2, in a transmission process, original data needs to be transmitted on a channel after source coding, channel coding, and modulation are performed on the original data, and a receive end performs demodulation, channel decoding, and source decoding on received data, to obtain the original data. The channel coding plays a crucial role in improving information transmission reliability in the entire communications system. As channel coding that can theoretically "achieve" a Shannon limit, a polar code has significant advantages in terms of data transmission reliability improvement, coverage enhancement, and the like. Embodiments of the present disclosure provide a data transmission method. Specifically, a transmit end performs polar code coding on to-be-coded bits based on an allocated resource, and after performing rate matching on coded bits, generates to-be-sent bits that include a redundant bit. The allocated resource includes a time-frequency resource, and a larger quantity of time-frequency resources may indicate a lower code rate. In a possible implementation, the transmit end may place the to-be-sent bits in a transmission buffer of the transmit end, and the transmit end reads some to-be-sent bits from the transmission buffer each time, for sending. The receive end performs decoding after receiving soft information of all the to-be-sent bits.

Figure 3:
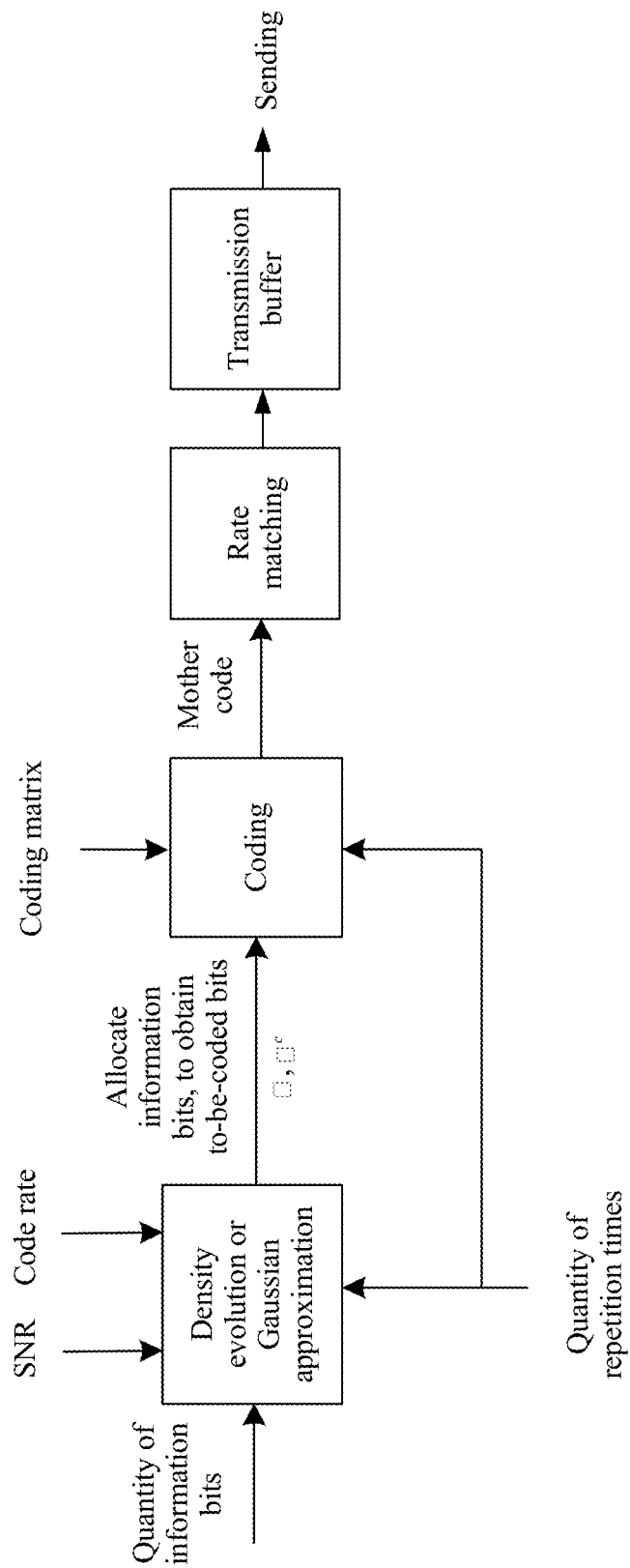
FIG. 3 is a schematic flowchart of a data transmission method according to an embodiment of the present disclosure.

FIG. 3 is a schematic flowchart of a data transmission method according to an embodiment of the present disclosure. As shown in FIG. 3, some bits in to-be-coded bits are used to carry information, and are referred to as information bits. A set of locations of the information bits in the to-be-coded bits is denoted as A. The other bits are set to fixed values that are agreed on by a receive end and a transmit end in advance, and are referred to as fixed bits. An index set of the fixed bits is denoted as a complementary set $A^c$ of A. The information bit index set A is selected in the following method: In a polar code coding process, a probability density function of each polar channel needs to be calculated through density evolution, Gaussian approximation, or the like, and sequence numbers of S polar channels with a minimum error probability (or highest reliability) are selected to form the set A. S is equal to a quantity of information bits. Specifically, the probability density function of each polar channel is calculated through Gaussian approximation based on a code rate and a signal-to-noise ratio (SNR) of the channel (this process may be represented by a Tanner graph of a polar code). Polar code coding is performed on the to-be-coded bits based on the obtained A or $A^c$ by using a generator matrix, to obtain a mother code of the polar code. The mother code may be considered as a code that is obtained after coding and that exists before rate matching. After rate matching is performed on the mother code, the mother code is input into a transmission buffer and is sent.

In a possible implementation, when the information bit index set A is obtained through density evolution, Gaussian approximation, or the like, the set A may be obtained based on K times of a total length of the to-be-coded bits, or the set A may be obtained after the to-be-coded bits are repeated for K times. In another possible implementation, if a length of bits that can be sent by the transmit end each time is M, and a quantity of sending times is K, a code length of the mother code of the polar code may be determined as $2^{\lceil \log_2(M \cdot K) \rceil}$. Optionally, if a quantity of sending times is K, and lengths of bits sent at K times are respectively $M_1$, $M_2$, ..., $M_K$, a code length of the mother code may be $2^{\lceil \log_2(M_1 + M_2 + \ldots + M_K) \rceil}$, where K, M, $M_1$, $M_2$, ..., and $M_K$ are all positive integers. Polar code coding is performed based on the code length of the mother code, to obtain a polar code that meets the code length of the mother code. To be specific, the transmit end needs to construct a mother code with a longer code length or a lower code rate. It should be noted that sending in this embodiment of the present disclosure is different from simple and unchanged repeat sending of to-be-sent data in the prior art. In this embodiment of the present disclosure, repetition is performed in a coding process, and sending is performed for a plurality of times. In addition, exactly because a code length obtained after repeated extension coding is used in the coding process, a parameter such as a generator matrix used in the coding process is different from that in the prior art.

Figure 4:
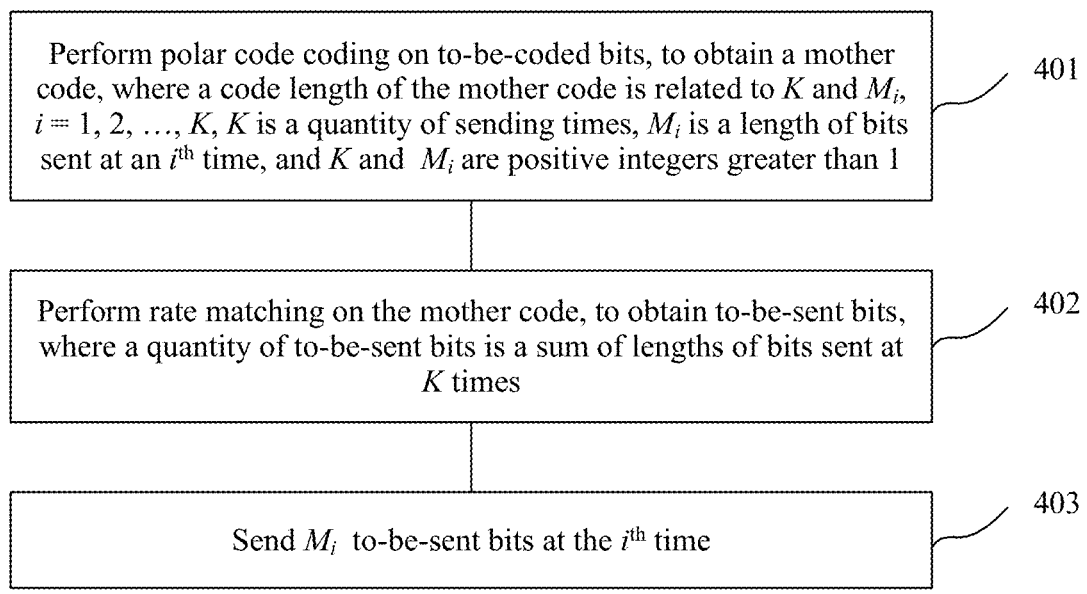
FIG. 4 is a schematic diagram of a data transmission method according to an embodiment of the present disclosure.

FIG. 4 is a schematic diagram of a data transmission method according to an embodiment of the present disclosure. As shown in FIG. 4, the method includes the following steps.

Step 401: Perform polar code coding on to-be-coded bits, to obtain a mother code, where a code length of the mother code is related to K and $M_i$, i=1, 2, ..., K, K is a quantity of sending times, $M_i$ is a length of bits sent at an $i^{th}$ time, and K and $M_i$ are positive integers greater than 1.

Specifically, the code length of the mother code may be $$2^{\lceil \log_2(\sum_{i=1}^{K} M_i) \rceil}.$$

Figure 5:
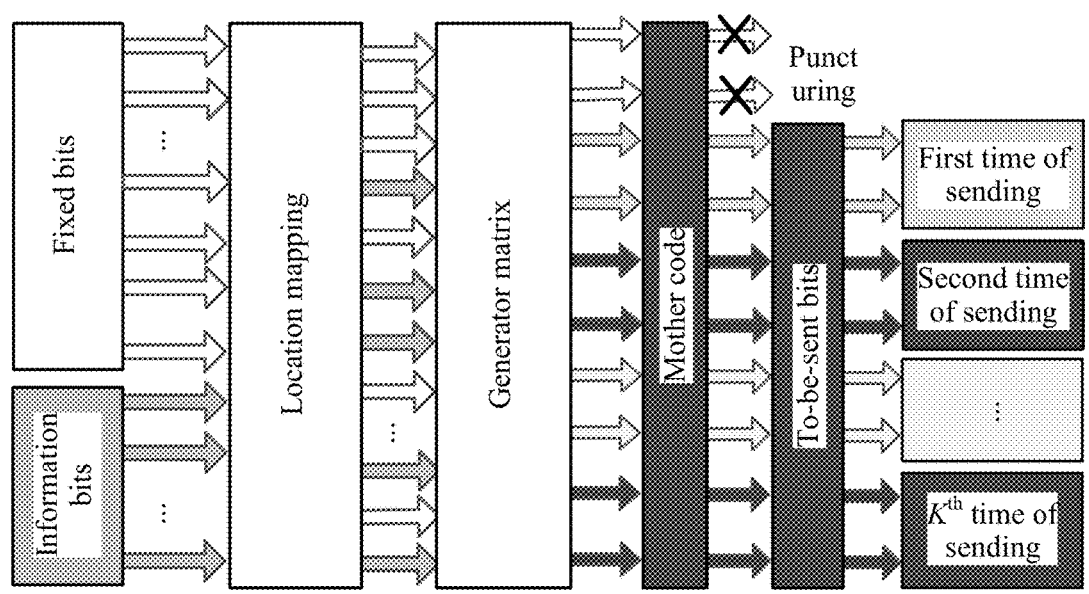
FIG. 5 is a schematic diagram of a bit stream according to an embodiment of the present disclosure.

FIG. 5 is a schematic diagram of a bit stream according to an embodiment of the present disclosure. As shown in FIG. 5, location mapping is separately performed on information bits and fixed bits based on an index set A of the information bits and an index set $A^c$ of the fixed bits, to obtain to-be-coded bits. The to-be-coded bits are coded by using a generator matrix, to obtain a mother code (or coded bits). The generator matrix is $G_N = B_N F_2^{\otimes(\log_2(N))}$, and N is a code length of the mother code.

It should be noted that although the mother code is considered as a code obtained after coding in the description of FIG. 3, a code length of a mother code that meets an actual requirement may be pre-determined during actual implementation. In other words, a code with a specific code length may be obtained through coding based on the actual requirement.

Step 402: Perform rate matching on the mother code, to obtain to-be-sent bits, where a quantity of the to-be-sent bits is a sum of lengths of bits sent at K times.

The rate matching may be implemented through puncturing. As shown in FIG. 5, the mother code (or the coded bits) is punctured, to obtain to-be-sent bits. Specifically, based on $M_1, M_2, \ldots, M_K$ and K, the quantity of the to-be-sent bits is $M_1+M_2+\ldots+M_K$, namely, $$\sum_{i=1}^{K} M_i.$$

If $$\sum_{i=1}^{K} M_i$$

is less than $$2^{\lceil \log_2(\Sigma_{i=1}^{K} M_i) \rceil},$$

a transmit end needs to select $$2^{\lceil \log_2(\Sigma_{i=1}^{K} M_i) \rceil} - \sum_{i=1}^{K} M_i$$

bits for puncturing, to obtain the to-be-sent bits. Further, a puncturing scheme may be any puncturing scheme that is preset or is indicated by using signaling. For example, the puncturing scheme may be a quasi-uniform puncturing (QUP) scheme or a uniform puncturing scheme. If $$\sum_{i=1}^{K} M_i$$

is equal to $$2^{\lceil \log_2(\Sigma_{i=1}^{K} M_i) \rceil},$$

the mother code is directly used as the to-be-sent bits.

Step 403: Send $M_i$ to-be-sent bits at the $i^{th}$ time.

The to-be-sent bits are sent based on a length of bits sent each time and the quantity of sending times. As shown in FIG. 5, the to-be-sent bits are sent in batches based on a preset quantity of sending times. For example, if the to-be-sent bits are $(x_1, x_2, \ldots, x_i, x_{i+1}, \ldots, x_{MK})$, $(x_1, x_2, \ldots, x_M)$ may be sent at a first time, $(x_{M+1}, \ldots, x_{2M})$ may be sent at a second time, and so on, and $(x_1, x_2, \ldots, x_{MK})$ may be sent at K times. Optionally, the to-be-sent bits are sent at K times, and lengths of bits sent at the K times are respectively $M_1, M_2, \ldots, M_K$. For example, $M_1$ bits may be randomly sent at a first time, $M_2$ bits may be randomly sent at a second time, and so on, until all the to-be-sent bits are sent.

Figure 5A:
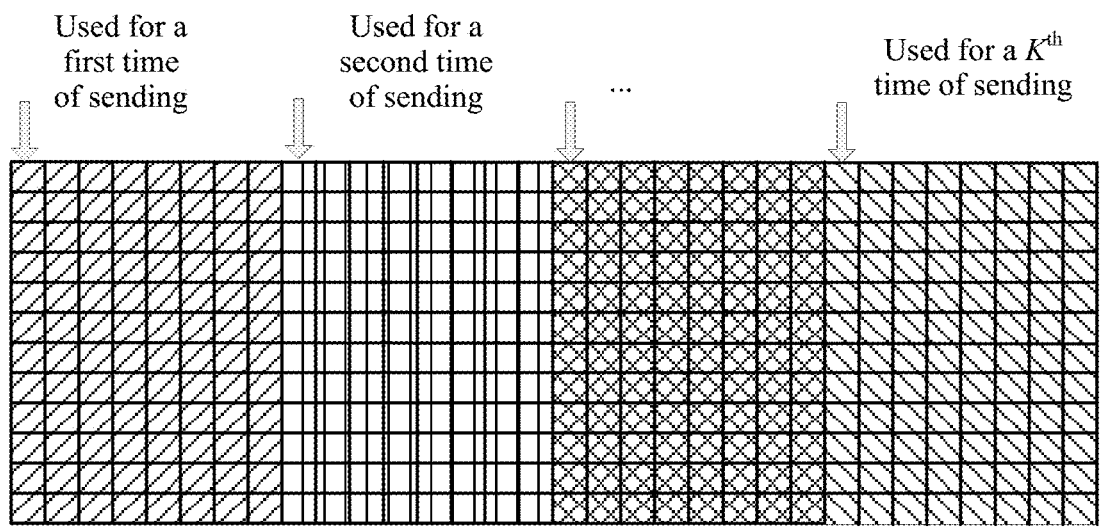
FIG. 5a is a schematic diagram of locations of to-be-sent bits in a transmission buffer.

In another possible implementation, K bit groups that are included in the to-be-sent bits and whose sizes are M may be placed in a transmission buffer for sending at K times. FIG. 5a is a schematic diagram of locations of to-be-sent bits in a transmission buffer. As shown in FIG. 5a, the to-be-sent bits are sequentially placed in the transmission buffer. When the to-be-sent bits start to be sent, corresponding bit groups are sent in sending order. Further, a case in which lengths of bits sent at K times are respectively $M_1, M_2, \ldots, M_K$ is similar to the case shown in FIG. 5, and details are not described herein again.

It should be noted that FIG. 5 and FIG. 5a only describe and show related problems, and neither a specific quantity of bits nor a specific puncturing scheme is limited in the present disclosure. For example, if $M_1, M_2, \ldots, M_K$ are all equal to M, the code length of the mother code is $2^{\lceil \log_2(M \cdot K) \rceil}$, and the length of bits sent each time is M.

Figure 4A:
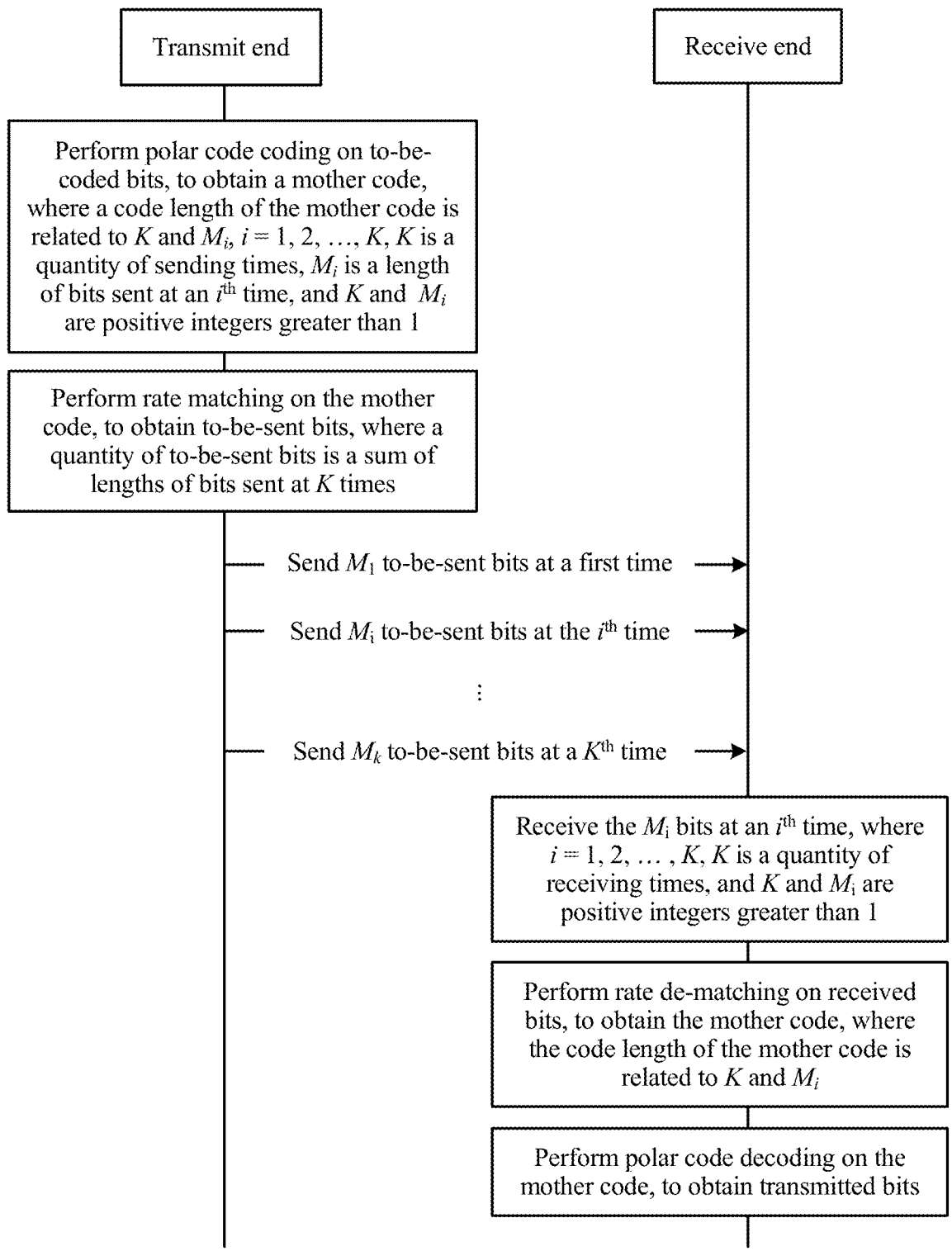
FIG. 4a is a schematic diagram of another data transmission method according to an embodiment of the present disclosure.

FIG. 4a is a schematic diagram of another data transmission method according to an embodiment of the present disclosure.

As shown in FIG. 4a, after step 403, the data transmission method further includes the following steps:

Step 404: Receive the $M_i$ bits at an $i^{th}$ time, where $i=1, 2, \ldots, K$, K is a quantity of receiving times, and K and $M_i$ are positive integers greater than 1.

Step 405: Perform rate de-matching on received bits, to obtain the mother code, where the code length of the mother code is related to K and $M_i$.

Step 406: Perform polar code decoding on the mother code, to obtain transmitted bits.

The code length of the mother code is $$2^{\lceil \log_2(\Sigma_{i=1}^{K} M_i) \rceil}.$$

Further, a receive end receives $$\sum_{i=1}^{K} M_i$$

bits in total. If $$\sum_{i=1}^{K} M_i$$

is less than $$2^{\lceil \log_2(\Sigma_{i=1}^{K} M_i) \rceil},$$

the $$\sum_{i=1}^{K} M_i \neq$$

bits are de-punctured, to obtain the mother code, where a quantity of de-punctured bits is $$2^{\lceil \log_2(\Sigma_{i=1}^K M_i)\rceil} - \sum_{i=1}^K M_i;$$

or if $$\sum_{i=1}^K M_i$$

is equal to $$2^{\lceil \log_2(\Sigma_{i=1}^K M_i)\rceil},$$

the $$\sum_{i=1}^K M_i$$

bits are used as the mother code.

Optionally, the quantity of receiving times is preset or is indicated by using signaling.

According to the data transmission method provided in this embodiment of the present disclosure, a coding gain can be fully used, and the method is simple and feasible. Different quantities of sending times may support different coverage areas. A coder needs to optimize coding based on the quantity of sending times, and does not need to send signaling in real time to request retransmission, so that a larger coverage area can be supported by using relatively low signaling overheads.

For a coverage enhancement scenario, more resources may be reserved to transmit an information block with a same size. A larger quantity of reserved resources indicates a larger quantity of sending times.

Figure 6:
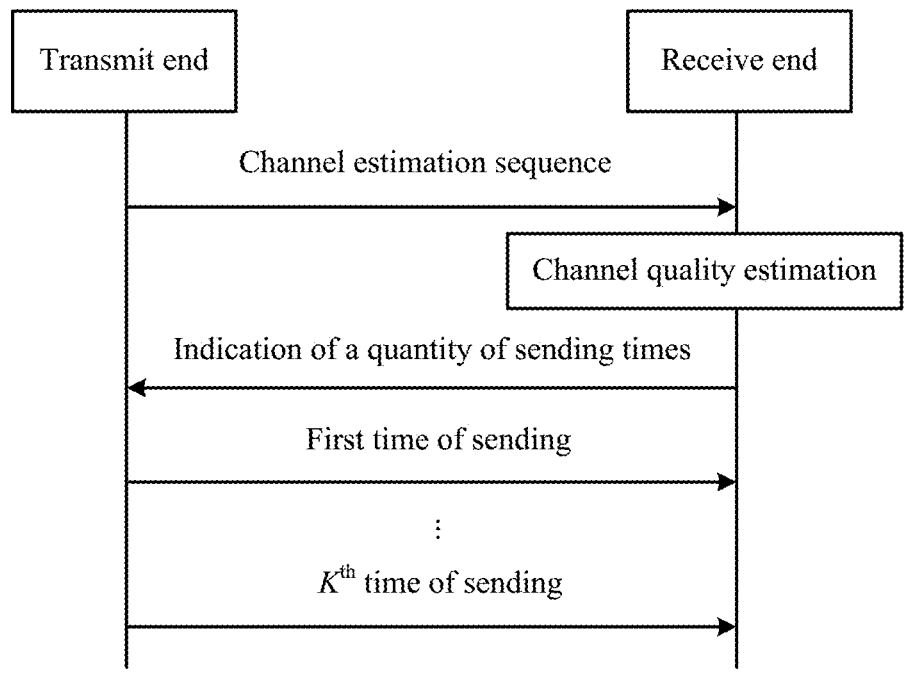
FIG. 6 is a schematic flowchart of data sending signaling according to an embodiment of the present disclosure.

Further, the quantity of sending times may be preset or may be indicated by using signaling. FIG. 6 is a schematic flowchart of data sending signaling according to an embodiment of the present disclosure. As shown in FIG. 6, a quantity of sending times may be determined by feeding back, by a receive end, an indication of the quantity of sending times to a transmit end.

Specifically, the receive end receives a channel estimation sequence from the transmit end.

The receive end performs channel quality estimation based on the channel estimation sequence.

The receive end sends the indication of the quantity of sending times to the transmit end based on a channel quality estimation result. Better channel quality indicates a smaller quantity of sending times. Optionally, a larger quantity of available transmission resources indicates a larger quantity of sending times.

Further, the transmit end performs polar code coding on to-be-coded bits based on the received indication of the quantity of sending times, and the transmit end sends data to the receive end in batches based on the quantity of sending times.

Figure 7:
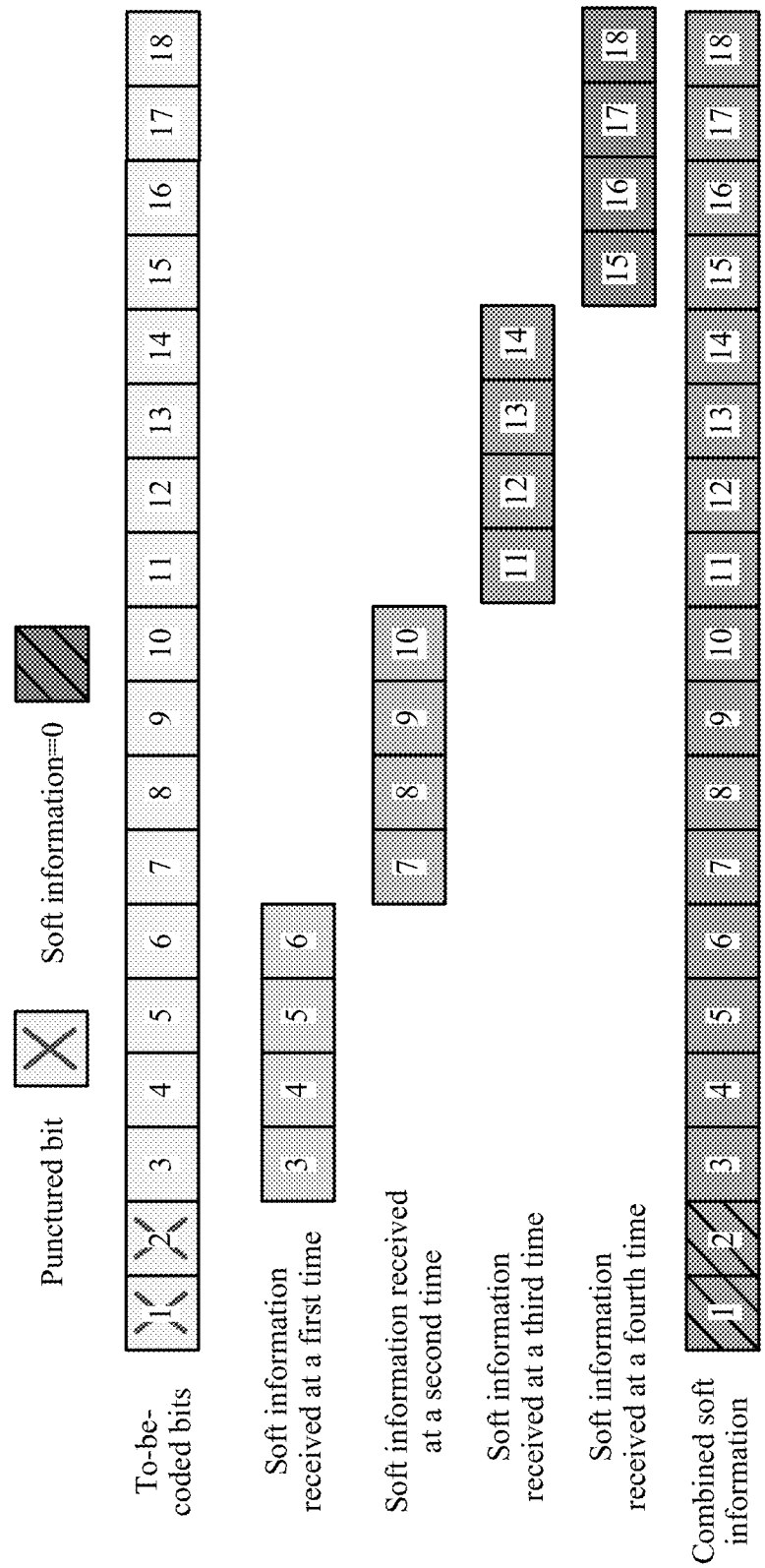
FIG. 7 is a schematic diagram of a polar code decoding method according to an embodiment of the present disclosure.

In addition, the receive end receives the data from the transmit end, and combines and decodes all the received data. Specifically, the receive end receives soft information, and combines all the soft information for decoding. A punctured location needs to be filled with 0. Four receiving times are used as an example for description. FIG. 7 is a schematic diagram of a polar code decoding method according to an embodiment of the present disclosure. As shown in FIG. 7, soft information received at four times is combined, and punctured locations (for example, locations 1 and 2 in FIG. 7) are filled with 0; and then obtained combined soft information is decoded to obtain a decoded sequence.

Figure 8:
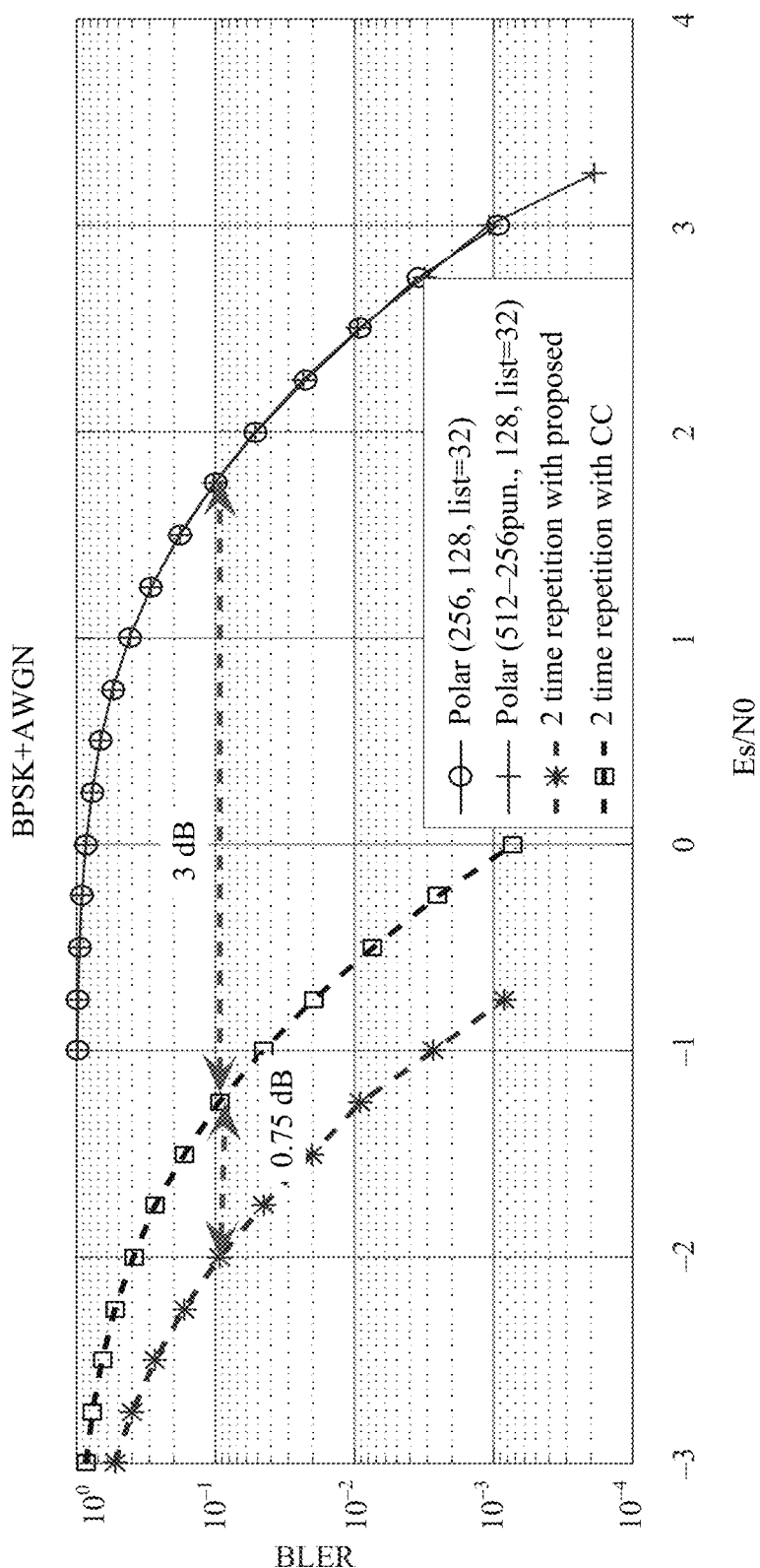
FIG. 8 is a schematic diagram of polar code coding performance in a case of two sending times according to an embodiment of the present disclosure.
Figure 9:
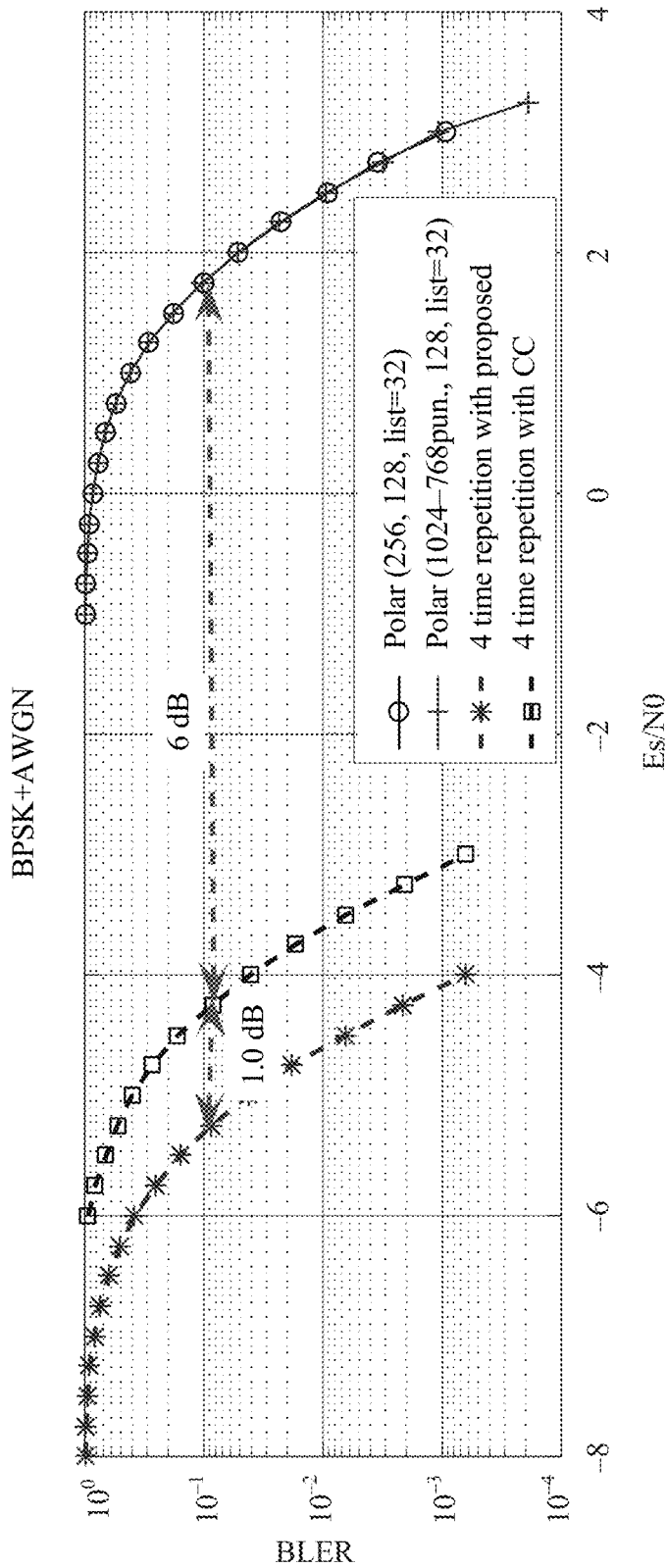
FIG. 9 is a schematic diagram of polar code coding performance in a case of four sending times according to an embodiment of the present disclosure.

In this embodiment of the present disclosure, polar code coding is optimized for a special scenario that supports coverage enhancement in the IoT. Information bits are repeatedly coded in a coding phase, so that a polar code coding gain is fully used, and system performance is improved. FIG. 8 is a schematic diagram of polar code coding performance in a case of two sending times according to an embodiment of the present disclosure. FIG. 9 is a schematic diagram of polar code coding performance in a case of four sending times according to an embodiment of the present disclosure. In FIG. 8 and FIG. 9, under additive white Gaussian noise (AWGN) channel and binary phase shift keying (BPSK) modulation, the polar code coding performance in the case of two sending times and the polar code coding performance in the case of four sending times are separately compared with performance of convolutional coding (a case of repeating same coded bits) in the prior art. There are 256 to-be-sent bits and 128 information bits. It can be learned that according to the method provided in this embodiment of the present disclosure, there is an obvious performance gain in cases of different quantities of sending times. In addition, because there is no increase in a quantity of information bits and only a fixed bit is added, a receive end may not decode the fixed bit during decoding, so that no excessive pressure is imposed on a decoder in the method provided in this embodiment of the present disclosure.

Figure 10:
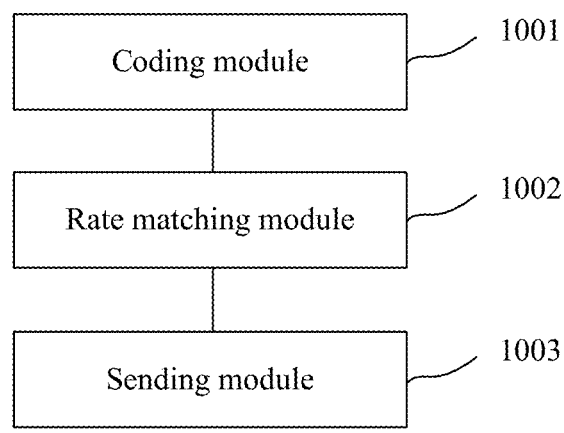
FIG. 10 is a possible schematic structural diagram of a data transmission apparatus according to an embodiment of the present disclosure.

FIG. 10 is a possible schematic structural diagram of a data transmission apparatus according to an embodiment of the present disclosure. As shown in FIG. 10, the data transmission apparatus includes:

a coding module 1001, configured to perform polar code coding on to-be-coded bits, to obtain a mother code, where a code length of the mother code is related to K and $M_i$, i=1, 2, ..., K, K is a quantity of sending times, $M_i$ is a length of bits sent at an $i^{th}$ time, and K and $M_i$ are positive integers greater than 1;

a rate matching module 1002, configured to perform rate matching on the mother code obtained by the coding module 1001, to obtain to-be-sent bits, where a quantity of the to-be-sent bits is a sum of lengths of bits sent at K times; and a sending module 1003, configured to send $M_i$ to-be-sent bits at the $i^{th}$ time.

Optionally, the code length of the mother code is $$2^{\lceil \log_2(\Sigma_{i=1}^K M_i)\rceil}.$$

Further, the performing rate matching on the mother code, to obtain to-be-sent bits includes:

if $\sum_{i=1}^K M_i$ is less than $$2^{\lceil \log_2(\Sigma_{i=1}^K M_i) \rceil},$$

puncturing $$2^{\lceil \log_2(\Sigma_{i=1}^K M_i) \rceil} - \sum_{i=1}^{K} M_i$$

mother code, to obtain the to-be-sent bits; or if $$\sum_{i=1}^{K} M_i$$

is equal to $$2^{\lceil \log_2(\Sigma_{i=1}^K M_i) \rceil},$$

using the mother code as the to-be-sent bits.

Some technical features, such as the quantity of sending times, the mother code, the polar code coding, and the rate matching, used in the foregoing apparatus embodiment are similar to or corresponding to some technical features used in the foregoing method embodiments, and are not described herein again.

Figure 11:
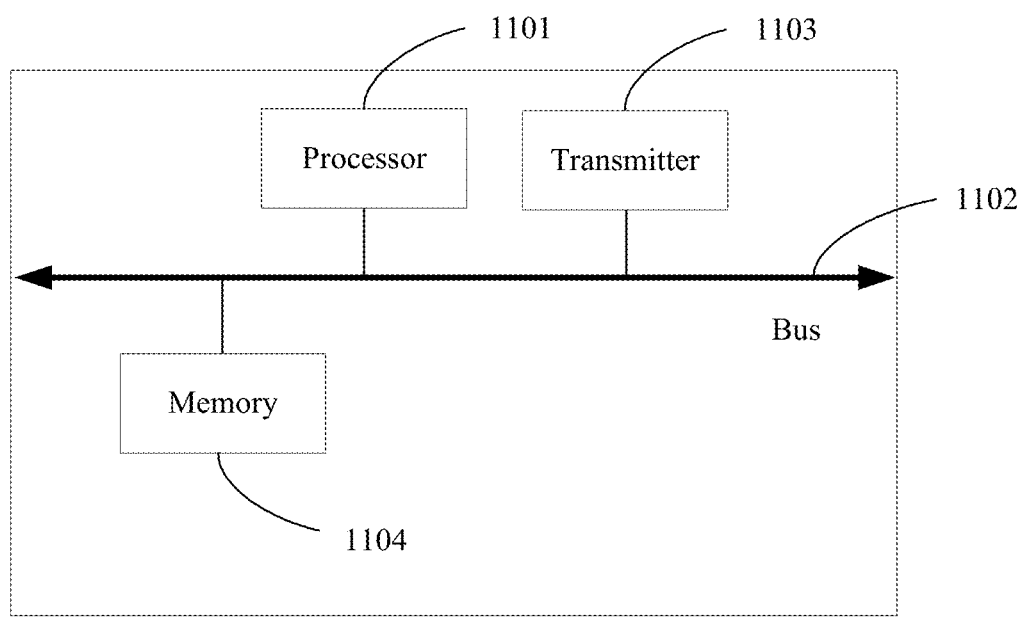
FIG. 11 is a possible schematic structural diagram of a data transmission device according to an embodiment of the present disclosure.

FIG. 11 is a possible schematic structural diagram of a data transmission device according to an embodiment of the present disclosure. As shown in FIG. 11, the data transmission device includes a processor 1101, a transmitter 1103, and a bus 1102. The processor 1101 and the transmitter 1103 are connected by using the bus 1102.

The processor 1101 is configured to: perform polar code coding on to-be-coded bits, to obtain a mother code, where a code length of the mother code is related to K and $M_i$, i=1, 2, . . . , K, K is a quantity of sending times, $M_i$ is a length of bits sent at an $i^{th}$ time, and K and $M_i$ are positive integers greater than 1; and perform rate matching on the mother code, to obtain to-be-sent bits, where a quantity of the to-be-sent bits is a sum of lengths of bits sent at K times.

The transmitter 1103 is configured to send $M_i$ to-be-sent bits at the $i^{th}$ time.

Optionally, the code length of the mother code is $$2^{\lceil \log_2(\Sigma_{i=1}^K M_i) \rceil}.$$

Further, the performing rate matching on the mother code, to obtain to-be-sent bits includes:
if $$\sum_{i=1}^{K} M_i$$

is less than $$2^{\lceil \log_2(\Sigma_{i=1}^K M_i) \rceil},$$

puncturing $$2^{\lceil \log_2(\Sigma_{i=1}^K M_i) \rceil} - \sum_{i=1}^{K} M_i$$

bits in the mother code, to obtain the to-be-sent bits; or if $$\sum_{i=1}^{K} M_i$$

is equal to $$2^{\lceil \log_2(\Sigma_{i=1}^K M_i) \rceil},$$

using the mother code as the to-be-sent bits.

Further, the data transmission device may further include a memory 1104. The memory 1104 is configured to store an instruction that is executed by the processor 1101.

Some technical features, such as the quantity of sending times, the mother code, the polar code coding, and the rate matching, used in the foregoing device embodiment are similar to or corresponding to some technical features used in the foregoing method embodiments, and are not described herein again. In addition, the data transmission device may be a network entity (for example, a base station), or may be a user terminal.

Figure 12:
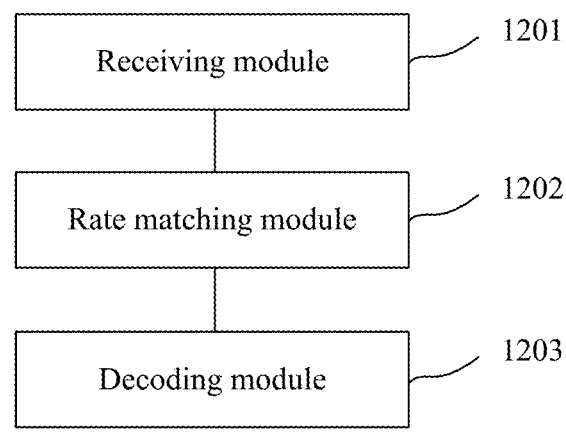
FIG. 12 is another possible schematic structural diagram of a data transmission apparatus according to an embodiment of the present disclosure.

FIG. 12 is another possible schematic structural diagram of a data transmission apparatus according to an embodiment of the present disclosure. As shown in FIG. 12, the data transmission apparatus includes:

a receive module 1201, configured to receive $M_i$ bits at an $i^{th}$ time, where i=1, 2, . . . , K, K is a quantity of receiving times, and K and $M_i$ are positive integers greater than 1;

a de-rate matching module 1202, configured to perform rate de-matching on bits received by the receiving module 1201, to obtain a mother code, where a code length of the mother code is related to K and $M_i$; and a decoding module 1203, configured to perform polar code decoding on the mother code, to obtain transmitted bits.

The code length of the mother code is $$2^{\lceil \log_2(\Sigma_{i=1}^K M_i) \rceil}.$$

Further, the receiving module 1201 receives $$\sum_{i=1}^{K} M_i$$

bits in total. If $$\sum_{i=1}^{K} M_i$$

is less than $$2^{\lceil \log_2(\Sigma_{i=1}^K M_i) \rceil},$$

the $$\sum_{i=1}^{K} M_i$$

bits are de-punctured, to obtain the mother code, where a quantity of de-punctured bits is $$2^{\lceil \log_2(\Sigma_{i=1}^{K} M_i) \rceil} - \sum_{i=1}^{K} M_i;$$

or if $$\sum_{i=1}^{K} M_i$$

is equal to $$2^{\lceil \log_2(\Sigma_{i=1}^{K} M_i) \rceil},$$

the $$\sum_{i=1}^{K} M_i$$

bits are used as the mother code.

Figure 13:
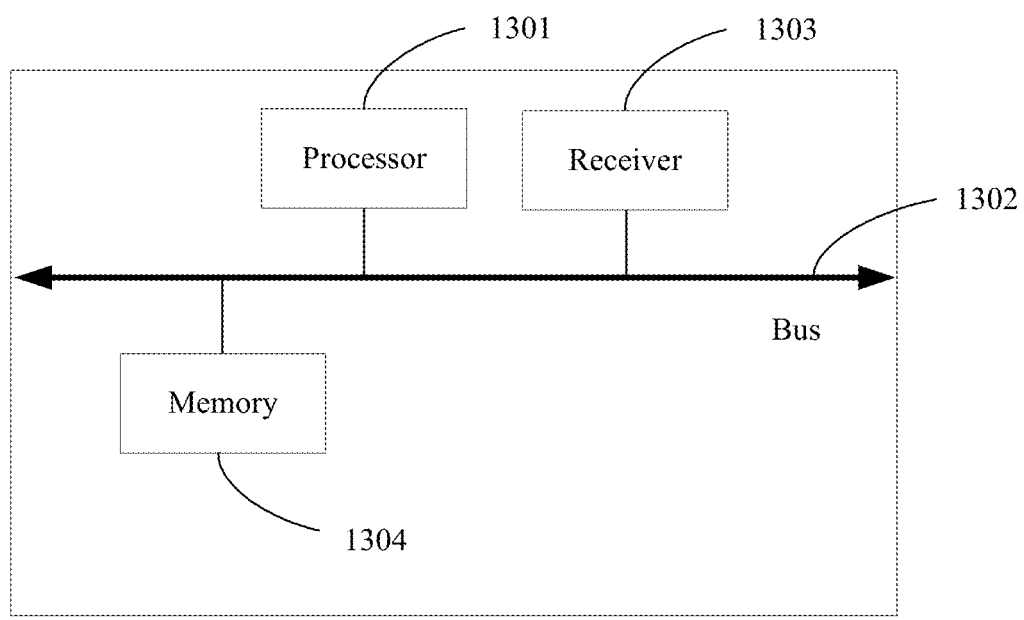
FIG. 13 is another possible schematic structural diagram of a data transmission device according to an embodiment of the present disclosure.

FIG. 13 is another possible schematic structural diagram of a data transmission device according to an embodiment of the present disclosure. As shown in FIG. 13, the data transmission device includes a processor 1301, a receiver 1303, and a bus 1302. The processor 1301 and the receiver 1303 are connected by using the bus 1302.

The receiver 1303 is configured to receive $M_i$ bits at an $i^{th}$ time, where i=1, 2, . . . , K, K is a quantity of receiving times, and K and $M_i$ are positive integers greater than 1.

The processor 1301 is configured to: perform rate de-matching on bits received by the receiver 1303, to obtain a mother code, where a code length of the mother code is related to K and $M_i$; and perform polar code decoding on the mother code, to obtain transmitted bits.

The code length of the mother code is $$2^{\lceil \log_2(\Sigma_{i=1}^{K} M_i) \rceil}.$$

Further, the receiver 1303 receives $$\sum_{i=1}^{K} M_i$$

bits in total. If $$\sum_{i=1}^{K} M_i$$

is less than $$2^{\lceil \log_2(\Sigma_{i=1}^{K} M_i) \rceil},$$

the $$\sum_{i=1}^{K} M_i$$

bits are de-punctured, to obtain the mother code, where a quantity of de-punctured bits is $$2^{\lceil \log_2(\Sigma_{i=1}^{K} M_i) \rceil} - \sum_{i=1}^{K} M_i$$

or if $$\sum_{i=1}^{K} M_i$$

is equal to $$2^{\lceil \log_2(\Sigma_{i=1}^{K} M_i) \rceil},$$

the $$\sum_{i=1}^{K} M_i$$

bits are used as the mother code.

Further, the data transmission device may further include a memory 1304. The memory 1304 is configured to store an instruction that is executed by the processor 1301.

The foregoing receive end apparatus and device receive data (for example, receive the data in batches) from the transmit end, and combines and decodes all the received data. Specifically, the receive end receives soft information, and combines all the soft information for decoding. The receive end apparatus and device embodiments include some technical features similar to or corresponding to those included in the transmit end, such as the quantity of receiving times, the mother code, the polar code decoding, and the rate matching. The technical features are similar to or corresponding to some technical features used in the foregoing method embodiments, and are not described herein again.

Embodiments of the present disclosure are described herein. Although the present disclosure is described in specific embodiments, it should be understood that the present disclosure should not be construed as being limited to these embodiments, but is explained according to the claims.

What is claimed is:
1. A data transmission method, comprising:
performing polar code coding on to-be-coded bits to obtain a mother code, wherein a code length of the mother code is

$$2^{\lceil \log_2(\Sigma_{i=1}^{K} M_i) \rceil},$$

K is a quantity of sending times, $M_i$ is a length of bits sent at an $i^{th}$ time, i=1, 2, ..., K, and K and $M_i$ are positive integers greater than 1;

performing rate matching on the mother code to obtain to-be-sent bits, wherein a quantity of the to-be-sent bits is a sum of lengths of bits sent at K times; and sending $M_i$ to-be-sent bits at the $i^{th}$ time.

2. The method according to claim 1, wherein performing rate matching on the mother code to obtain to-be-sent bits comprises:

when $$\sum_{i=1}^{K} M_i$$

is less than $$2^{\lceil \log_2(\Sigma_{i=1}^{K} M_i) \rceil},$$

puncturing $$2^{\lceil \log_2(\Sigma_{i=1}^{K} M_i) \rceil} - \sum_{i=1}^{K} M_i$$

bits in the mother code to obtain the to-be-sent bits; or when $$\sum_{i=1}^{K} M_i$$

is equal to $$2^{\lceil \log_2(\Sigma_{i=1}^{K} M_i) \rceil},$$

using the mother code as the to-be-sent bits.

3. The method according to claim 1, wherein:
the quantity of sending times is preset or is indicated by using signaling.

4. A data transmission apparatus, comprising:
a processor configured to:
perform polar code coding on to-be-coded bits to obtain a mother code, wherein a code length of the mother code is $$2^{\lceil \log_2(\Sigma_{i=1}^{K} M_i) \rceil},$$

K is a quantity of sending times, $M_i$ is a length of bits sent at an $i^{th}$ time, i=1, 2, ..., K, and K and $M_i$ are positive integers greater than 1, and perform rate matching on the mother code obtained by the coding module to obtain to-be-sent bits, wherein a quantity of the to-be-sent bits is a sum of lengths of bits sent at K times; and a transmitter configured to send $M_i$ to-be-sent bits at the $i^{th}$ time.

5. The apparatus according to claim 4, wherein the processor is configured to:

when $$\sum_{i=1}^{K} M_i$$

is less than $$2^{\lceil \log_2(\Sigma_{i=1}^{K} M_i) \rceil},$$

puncture $$2^{\lceil \log_2(\Sigma_{i=1}^{K} M_i) \rceil} - \sum_{i=1}^{K} M_i$$

bits in the mother code, to obtain the to-be-sent bits; or when $$\sum_{i=1}^{K} M_i$$

is equal to $$2^{\lceil \log_2(\Sigma_{i=1}^{K} M_i) \rceil},$$

use the mother code as the to-be-sent bits.

6. The apparatus according to claim 4, wherein:
the quantity of sending times is preset or is indicated by using signaling.

7. A data transmission device, comprising:
a bus;
a processor coupled to the bus and configured to:
perform polar code coding on to-be-coded bits to obtain a mother code, wherein a code length of the mother code is $$2^{\lceil \log_2(\Sigma_{i=1}^{K} M_i) \rceil},$$

K is a quantity of sending times, $M_i$ is a length of bits sent at an $i^{th}$ time, i=1, 2, ..., K, and K and $M_i$ are positive integers greater than 1, and perform rate matching on the mother code to obtain to-be-sent bits, wherein a quantity of the to-be-sent bits is a sum of lengths of bits sent at K times; and a transmitter coupled to the bus and configured to send $M_i$ to-be-sent bits at the $i^{th}$ time.

8. The device according to claim 7, wherein the processor is configured to:
when $$\sum_{i=1}^{K} M_i$$

is less than $$2^{\lceil log_2(\Sigma_{i=1}^{K} M_i) \rceil},$$

puncture $$2^{\lceil log_2[(\Sigma_{i=1}^{K} M_i)] \rceil} - \sum_{i=1}^{K} M_i$$

bits in the mother code to obtain the to-be-sent bits; or
when $$\sum_{i=1}^{K} M_i$$

is equal to $$2^{\lceil log_2(\Sigma_{i=1}^{K} M_i) \rceil},$$

use the mother code as the to-be-sent bits.

9. The device according to claim 7, wherein:
the quantity of sending times is preset or is indicated by using signaling.

10. A data transmission device, comprising:
a bus;
a receiver coupled to the bus and configured to:
receive $M_i$ bits at an $i^{th}$ time, wherein i=1, 2, ..., K, K is a quantity of receiving times, and K and $M_i$ are positive integers greater than 1; and
a processor coupled to the bus and configured to:
perform rate de-matching on received bits to obtain a mother code, wherein a code length of the mother code is $$2^{\lceil log_2(\Sigma_{i=1}^{K}) M_i \rceil},$$

and
perform polar code decoding on the mother code to obtain transmitted bits.

11. The device according to claim 10, wherein:
the receiver is configure to receive $$\sum_{i=1}^{K} M_i$$

bits; and
the processor is configured to:
when $$\sum_{i=1}^{K} M_i$$

is less than $$2^{\lceil log_2(\Sigma_{i=1}^{K} M_i) \rceil},$$

de-puncture the $$\sum_{i=1}^{K} M_i$$

bits to obtain the mother code, wherein a quantity of de-punctured bits is $$2^{\lceil log_2[(\Sigma_{i=1}^{K} M_i)] \rceil} - \sum_{i=1}^{K} M_i,$$

or
when $$\sum_{i=1}^{K} M_i$$

is equal to $$2^{\lceil log_2(\Sigma_{i=1}^{K} M_i) \rceil},$$

use the $$\sum_{i=1}^{K} M_i$$

bits as the mother code.

* * * * *

UNITED STATES PATENT AND TRADEMARK OFFICE
CERTIFICATE OF CORRECTION

PATENT NO. : 10,812,215 B2
APPLICATION NO. : 16/218719
DATED : October 20, 2020
INVENTOR(S) : Ying Chen, Hejia Luo and Rong Li Page 1 of 1

It is certified that error appears in the above-identified patent and that said Letters Patent is hereby corrected as shown below:

Column 21, Line 20, Claim 8, should read --$2^{\lceil \log_2(\Sigma_{i=1}^{K} M_i) \rceil}$--, therefor.

Column 22, Line 36, Claim 11, should read --$2^{\lceil \log_2(\Sigma_{i=1}^{K} M_i) \rceil}$--, therefor.

Signed and Sealed this
Sixteenth Day of February, 2021

Drew Hirshfeld
*Performing the Functions and Duties of the*
*Under Secretary of Commerce for Intellectual Property and*
*Director of the United States Patent and Trademark Office*